United States Patent
Yin et al.

(10) Patent No.: US 8,809,173 B1
(45) Date of Patent: Aug. 19, 2014

(54) FIN FIELD-EFFECT TRANSISTORS AND FABRICATION METHOD THEREOF

(71) Applicant: Semiconductor Manufacturing International (Shanghai) Corporation, Shanghai (CN)

(72) Inventors: Huaxiang Yin, Shanghai (CN); Mieno Fumitake, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/940,283

(22) Filed: Jul. 12, 2013

(30) Foreign Application Priority Data

Feb. 28, 2013 (CN) .......................... 2013 1 0064769

(51) Int. Cl.
*H01L 21/38* (2006.01)

(52) U.S. Cl.
USPC .............................. 438/562; 438/285; 257/288

(58) Field of Classification Search
USPC ............... 257/E29.283, E21.444, E21.443, 257/E21.438, E21.414, E21.442, E21.661, 257/E27.1, E29.137, 347, 407, E21.196, 257/E21.2, E21.295, E21.43, E21.434, 257/E21.635, E27.112; 438/305, 152, 153, 438/197, 199, 231, 275, 291, 299, 300, 301, 438/285, 151, 154, 157, 270, 289, 302, 382, 438/591, 158, 217, 286, 287, 585, 586, 595, 438/128, 163, 212, 216, 221, 229, 230, 257, 438/268, 276, 278, 284, 294, 296, 303, 492, 438/509, 514, 558, 587, 589, 6, 703, 770
See application file for complete search history.

(56) References Cited

U.S. PATENT DOCUMENTS

2007/0155142 A1 7/2007 Jin et al.

*Primary Examiner* — Julio J Maldonado
*Assistant Examiner* — Robert Bachner
(74) *Attorney, Agent, or Firm* — Anova Law Group, PLLC

(57) ABSTRACT

A method is provided for fabricating a fin field-effect transistor. The method includes providing a semiconductor substrate; and forming a plurality of fins on top of the semiconductor substrate. The method also includes forming isolation structures between adjacent fins; and forming doping sidewall spacers in top portions of the isolation structures near the fins. Further, the method includes forming a punch-through stop layer at the bottom of each of the fins by thermal annealing the doping sidewall spacers; and forming a high-K metal gate on each of the fins.

14 Claims, 7 Drawing Sheets

FIN FIELD-EFFECT TRANSISTORS AND FABRICATION METHOD THEREOF

CROSS-REFERENCES TO RELATED APPLICATIONS

This application claims the priority of Chinese patent application No. 201310064769.5, filed on Feb. 28, 2013, the entirety of which is incorporated herein by reference.

FIELD OF THE INVENTION

The present invention generally relates to the field of semiconductor manufacturing technology and, more particularly, relates to fin field-effect transistors and fabrication techniques thereof.

BACKGROUND

In a metal-oxide-semiconductor field-effect transistor (MOSFET), voltage is applied on the gate to control the current in a channel region to generate a switching signal (on-off). However, when semiconductor technology enters into a sub-45 nm node, the channel current control ability of traditional planar MOSFETs may become weak, thus a severe leakage current may be generated. Fin field-effect transistors (FinFETs) are developed to replace the traditional planar MOSFETs. A FinFET is a multiple-gate device and may include semiconductor fin structures protruding from the surface of a semiconductor substrate, a gate structure covering top and side surfaces of the fin structure, and source/drain regions in the fin structure at both sides of the gate structure.

FIG. 1 illustrates a three dimensional structure of an existing FinFET. The FinFET includes a semiconductor substrate 101; a protruding fin 103 formed by etching a top portion of the semiconductor substrate 101 on the semiconductor substrate 101; a dielectric layer 104 covering the surface of the substrate 101 and a portion of the sidewalls of the fin 103; and a gate structure 105 crossing over the fin 103 and covering a portion of the top and the sidewalls of the fin 103. The gate structure 105 may include a gate dielectric layer (not shown) and a metal gate (not shown) on the gate dielectric layer.

However, during an operation of the FinFET, the bottom of the fin 103 may be relatively far from the gate structure 105, an electric field generated by the gate structure 105 may be relatively weak at the bottom of the fin 103. Thus, the control ability of the gate structure 105 may be relatively weak, a punch-through phenomenon from a source region to a drain region at the bottom of the fin 103 may be generated during the operation of the FinFET. In order to obtain a relatively high carrier mobility, the doping level of the fin 103 of the existing FinFET may be relatively low, the punch-through phenomenon may be more severe, and a short channel effect may become more severe too.

The disclosed device structures, methods and systems are directed to solve one or more problems set forth above and other problems.

BRIEF SUMMARY OF THE DISCLOSURE

One aspect of the present disclosure includes a method for fabricating a fin field-effect transistor. The method includes providing a semiconductor substrate; and forming a plurality of fins on top of the semiconductor substrate. The method also includes forming isolation structures between adjacent fins; and forming doping sidewall spacers in top portions of the isolation structures near the fins. Further, the method includes forming a punch-through stop layer at the bottom of each of the fins by thermal annealing the doping sidewall spacers; and forming a high-K metal gate on each of the fins.

Another aspect of the present disclosure includes a fin field-effect transistor (FinFET). The FinFET includes a semiconductor substrate having a plurality of fins and isolation structures, and embedded source/region regions at both sides of the fins. The FinFET also includes a punch-through stop layer at the bottom of each of the fins. Further, the FinFET includes a high-K metal gate and sidewall spacers on each of the fins. Further, the FinFET also includes a dielectric material layer covering the source/drain regions, the sidewall spacers, and the isolation structures.

Another aspect of the present disclosure includes a method for fabricating a fin field-effect transistor. The method includes providing a semiconductor substrate; and forming a plurality of fins on top of the semiconductor substrate. The method also includes forming isolation structures between adjacent fins; and forming doping sidewall spacers at fins. Further, the method includes forming a diffusion layer by thermal annealing the doping sidewall spacers; and forming a high-K metal gate on each of the fins.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

During an operation of the existing FinFET, the bottom of the fin may be relatively far from the gate structure, thus the control ability of the gate structure may be relatively weak. Further, the doping level of the fin may be relatively low, the space-charge region of the channel region may be extended under an electric field, the space-charge region of a source region and the space-charge region of a drain region may be conducted, which may cause a punch-through phenomenon from a source region to a drain region at the bottom of the fin of the FinFET. The disclosed embodiments overcome such problems by using punch through stop layers and fabrication method thereof.

Figure 10:
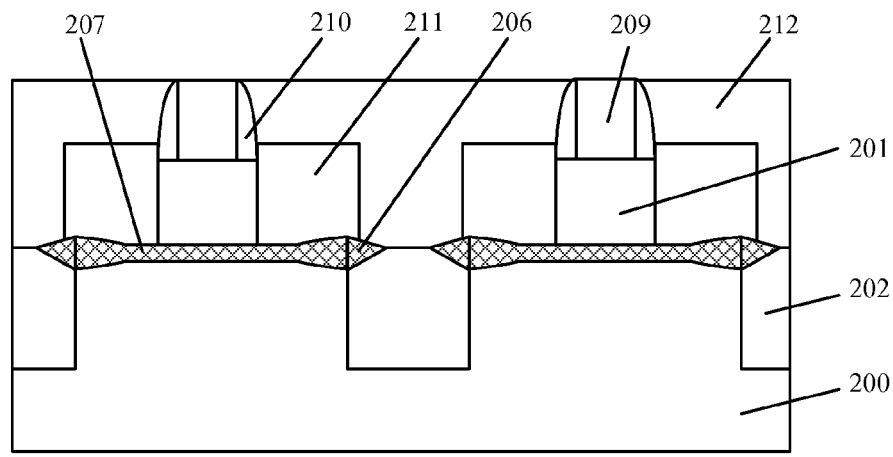
Figure 11:
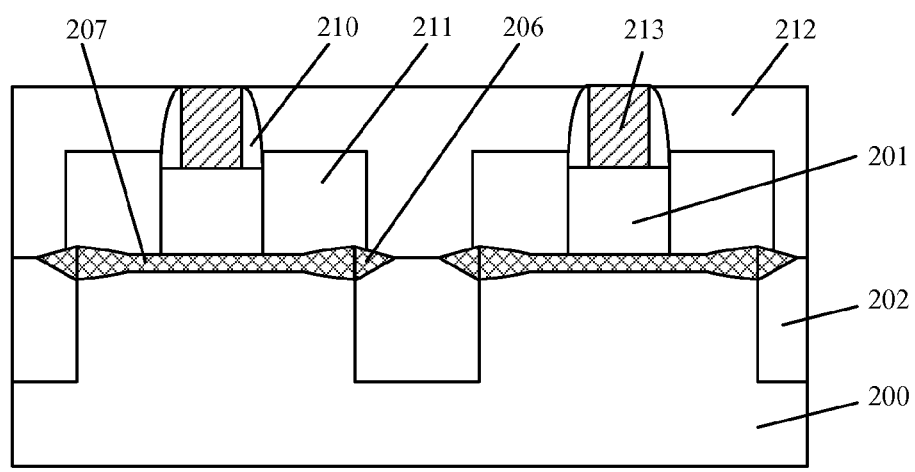
Figure 12:
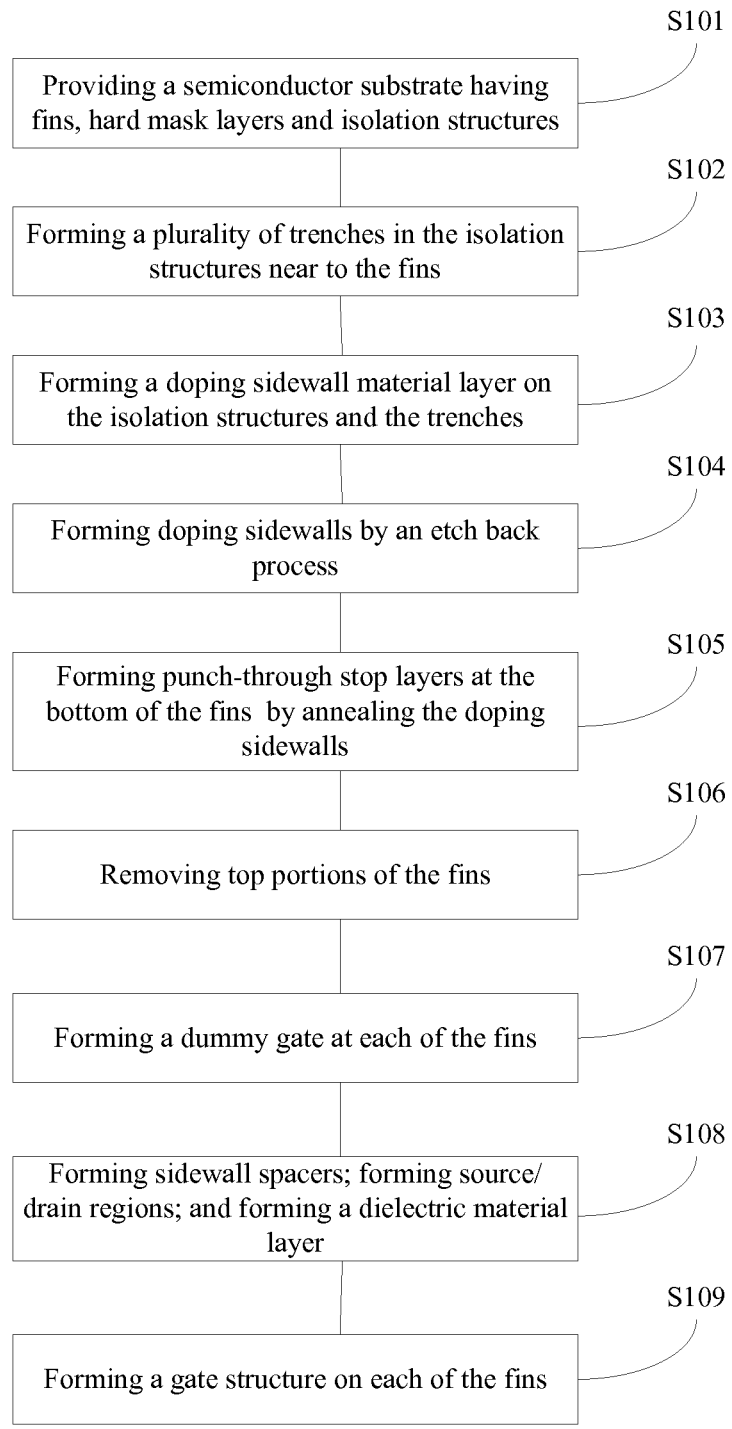
FIG. 12 illustrates an exemplary fabrication process for a fin field-effect transistor consistent with the disclosed embodiments.

FIG. 12 illustrates an exemplary fabrication process for a fin field-effect transistor (FinFET), and FIGS. 2-11 illustrate exemplary semiconductor structures corresponding to various stages of the fabrication process.

Figure 1:
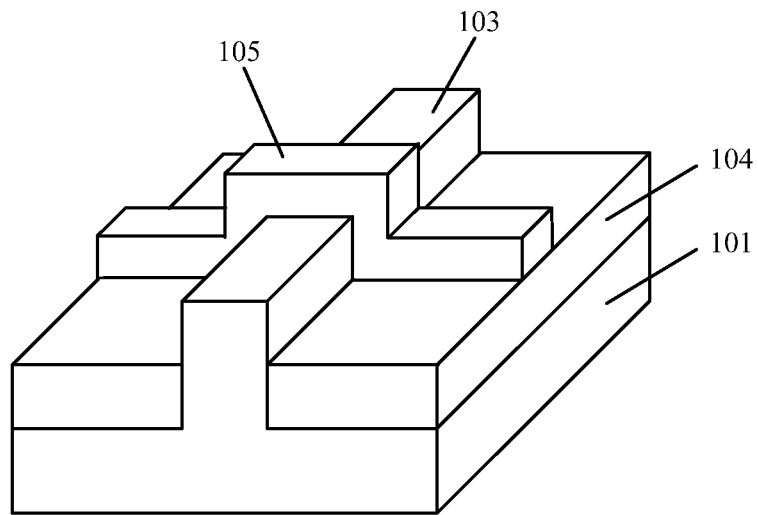
FIG. 1 illustrates an existing fin field-effect transistor.
Figure 2:
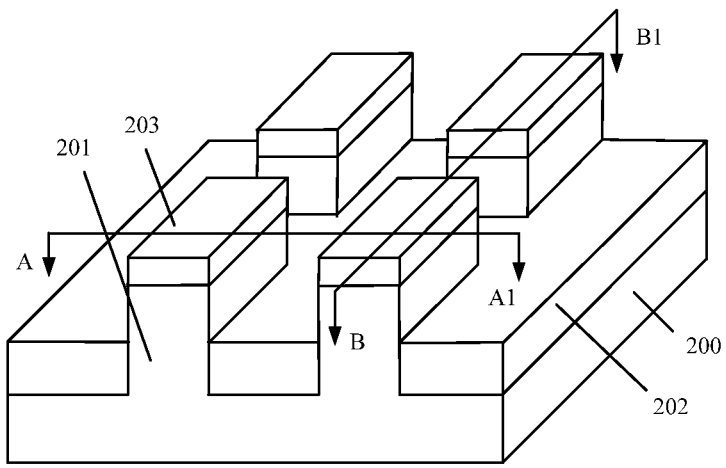
FIGS. 2-11 illustrate semiconductor structures corresponding to certain stages of an exemplary fabrication process for a fin field-effect transistor consistent with the disclosed embodiments.
Figure 3:
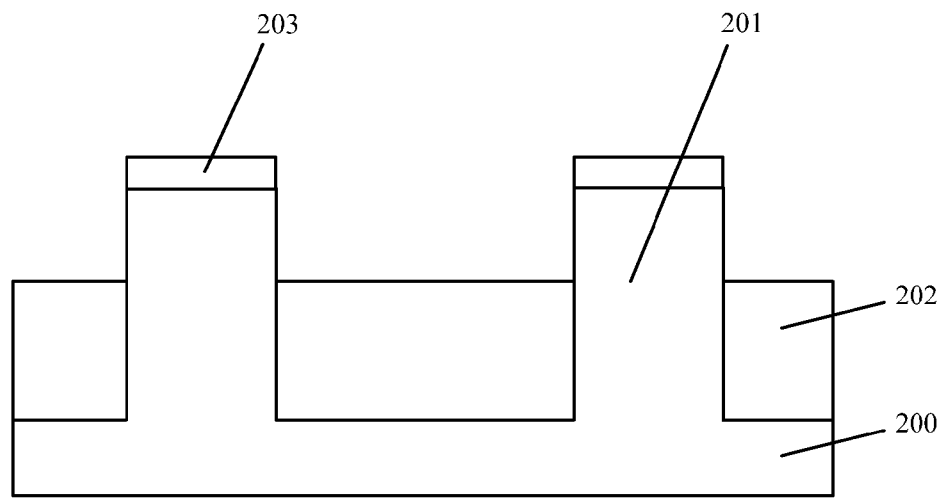

As shown in FIG. 12, at the beginning of the fabrication process, a semiconductor substrate with certain structures is provided (S101). FIG. 2 illustrates a corresponding semiconductor structure. FIG. 3 illustrates a cross-section view of the semiconductor structure illustrated in FIG. 2 along the "AA1" direction.

As shown in FIGS. 2-3, a semiconductor substrate 200 is provided. The substrate 200 may have a plurality of protruding fins 201 on one surface. Adjacent fins 201 are isolated by an isolation structure 202. The top surfaces of the fins 201 may be higher than a top surface of isolation structures 202.

The semiconductor substrate 200 may include any appropriate semiconductor material, such as silicon, silicon on insulator (SOI), silicon germanium, carborundum, indium antimonide, lead telluride, indium arsenide, indium phosphide, gallium arsenidie, gallium antimonite, alloy semiconductor or a combination thereof. The substrate 200 provides a base for subsequent processes and structures.

The fins 201 may be formed by etching the semiconductor substrate 200. An etching process for forming the fin 201 may be a dry etching process including a plasma etching process, or an ion beam etching process, etc. In certain other embodiments, the fins 201 may be formed by depositing a semiconductor material on the semiconductor substrate 200, followed by the etching process. The fins 201 may also be formed directly by depositing a semiconductor material on the semiconductor substrate 200 using a shadow mask having patterns of the plurality of fins 201. The fins 201 may be made of a same material as the semiconductor substrate 200, or a different semiconductor material including one or more of silicon, silicon germanium, carborundum, indium antimonide, lead telluride, indium arsenide, indium phosphide, gallium arsenidie, gallium antimonite, or alloy semiconductor, etc.

In one embodiment, a hard mask layer 203 may be formed on the top surface of each of the fins 201. The hard mask layer 203 may be a remaining hard mask layer of the process for forming the fins 201 by an etching process. The hard mask layer 203 may also be formed by an individual process. In one embodiment, the hard mask layer 203 is a remaining hard mask layer for forming the fins 201. The hard mask layer 203 may be made of any appropriate material, such as silicon oxide, silicon nitride, silicon oxynitride, or a stacked layer made of silicon oxide and silicon nitride, etc. Other appropriate material may also be used as the hard mask layer 203.

After forming the hard mask layers 203, the isolation structures 202 may be formed to isolate adjacent fins 201. Referring to FIG. 3, the top surfaces of the isolation structures 202 may be lower than top surfaces of the fins 201. In one embodiment, the isolation structures 202 may be shallow trench isolation (STI) structures. The STI structures may be made of any appropriate material such as silicon oxide, silicon nitride, or silicon oxynitride, etc. In one embodiment, the STI structures are made of silicon oxide.

The isolation structures 202 may be formed by sequentially: forming an isolation material layer on the surface of the semiconductor substrate 200 and the surfaces of the fins 201; polishing the isolation material layer using the hard mask layers 203 as a polishing stop layer, i.e., the polishing process may be stopped when it reaches the hard mask layer 203; and etching the isolation material layer to make the top surface of the isolation material layer lower than the surface of the fins 201. Thus, the isolation structures 203 (may also refer as STI structures) are formed.

The isolation material layer may be formed by various processes, such as a chemical vapor deposition (CVD) process, a physical vapor deposition (PVD) process, an atomic layer deposition (ALD) process, or a flowable chemical vapor deposition (FCVD) process, etc. The polishing process may be a chemical mechanical polishing process, or a mechanical polishing process, etc. The isolation material layer may be etched by a dry etching process, or wet etching process, etc.

Figure 4:
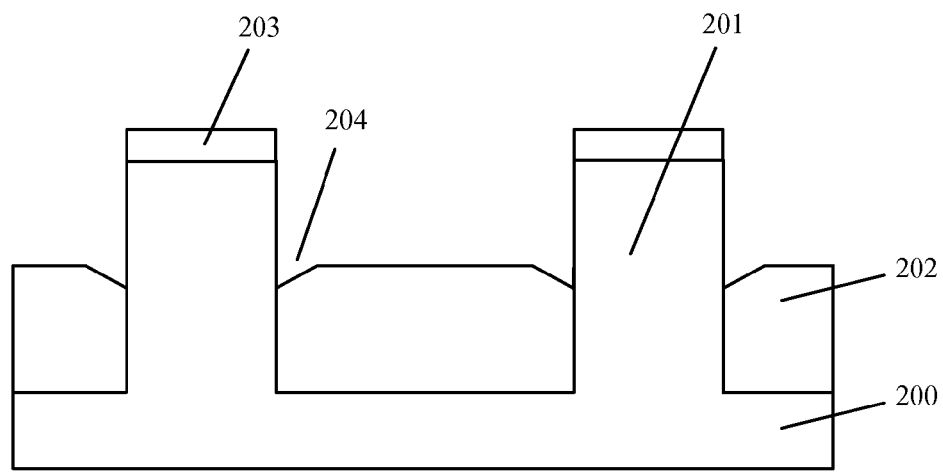

Returning to FIG. 12, after providing the semiconductor substrate 202 having the fins 201, the isolation structures 202 and the hard mask layers 203, a plurality of trenches may be formed (S102). FIG. 4 illustrates a corresponding semiconductor structure.

As shown in FIG. 4, a trench 204 (may also refer as a channel) is formed in a top portion of the isolation structure 202 near the fin 201. The trench 204 may be formed by etching the isolation structure 202 using the hard mask layer 203 as an etching mask (may refer as a STI recess process).

Various etching processes may be used to form the trench 204, such as a dry etching process including a plasma etching process, or an ion beam etching process, or a wet etching process, etc. In one embodiment, a dry etching process is used to etch the isolation structure 202 to form the trench 204.

Specifically, by adjusting parameters of the dry etching process, the trench 204 may be formed in the top portion of the isolation structure 202 near the fin 201. The dry etching process may be a reactive plasma etching (RIE) process. Various gases may be used as etching gases of the RIE process. In one embodiment, $NH_3$ and HF are used as the etching gas of the RIE process.

During the RIE process, $NH_3$ and HF may react with silicon oxide of the isolation structure 202, certain kinds of polymer may be formed, such as $(NH_4)_2SiF_6$, etc. The polymer may accumulate (or redeposit) on the surface of the isolation structure 202. Due to a barrier effect of the fins 201, the polymer may mainly be formed in the middle region of the isolation structure 202. Since the polymer may reduce the etching rate, the etching rate at the middle region of the isolation structure 202 may be smaller than the etching rate at the top portion of isolation structure 202 near the fin 201. Thus, the trench 204 may be formed in the top portion of the isolation structure 202 near the fin 201 by the RIE etching process. A depth of the trench 204 may be approximately of 5 nm, 10 nm, 15 nm, or 30 nm etc.

A doping sidewall spacer material layer may be subsequently formed on the isolation structures 202, and fill up the trenches 204. Further, an etch back process may be subsequently performed on the doping sidewall spacer material layer. Since the thickness of the portion of the doping sidewall spacer material layer in the trenches 204 may be relative large, the portion of the doping sidewall spacer material layer in the trenches 204 may be kept after the etch back process, the volume of a subsequently formed doping sidewall spacer may be relatively large. Therefore, more doping ions of the doping sidewall spacer may diffuse into the fins 201 after a subsequent heat diffusion process, the doping concentration of a punch-through stop layer may be increased.

In certain other embodiments, the process for the trenches 204 may be same as the process for the isolation structures 202, and the process for the trenches 204 may be simplified.

In certain other embodiments, the trenches 204 may unnecessarily formed. A doping sidewall spacer material layer may be formed on the isolation structures 202. After an etch back process, doping sidewall spacers may be formed. Thus, a process for the doping sidewall spacers may be simplified.

Figure 5:
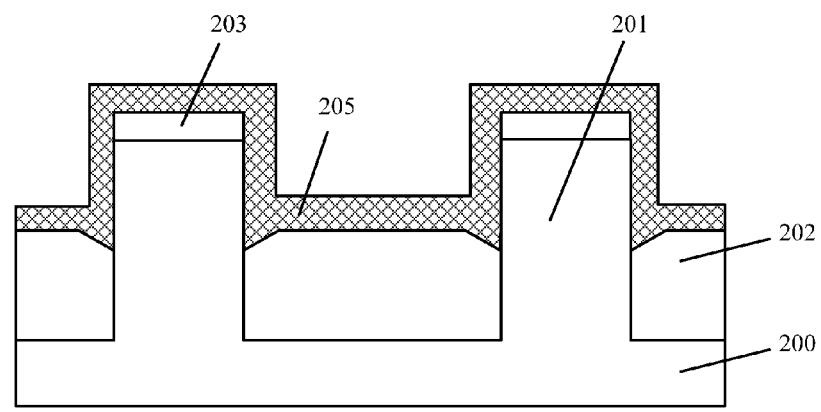

Returning to FIG. 12, after forming the trenches 204, a doping sidewall spacer material layer may be formed (S103). FIG. 5 illustrates a corresponding semiconductor structure.

As shown in FIG. 5, a doping sidewall spacer material layer 205 is formed on surfaces of the isolation structures 204 and surfaces of the hard mask layers 203. The doping sidewall spacer material layer 205 also covers the fins 201 and fills up the trenches 204.

The doping sidewall spacer material layer 205 may be made of any appropriate material, such as silicon oxide, silicon nitride, silicon oxynitride, silicon carbonitride, etc. The doping sidewall spacer material layer 205 may also be made of one or more of high dielectric constant (high-K) material including $HfO_2$, HfSiO, HfSiON, HfTaO, HfZrO, $Al_2O_3$ and $ZrO_2$, etc. The doping sidewall spacer material layer 205 may also be made of one or more of low dielectric constant (low-K) material including SiCON, SiBCN, and SiBOCN, etc. In one embodiment, the doping sidewall spacer material layer 205 is made of silicon nitride.

The doping sidewall spacer material layer 205 may have a same doping type with the fins 201. A doping concentration of the doping sidewall spacer material layer 205 may be greater than a doping concentration of the fins 201. Doping ions of the doping sidewall material layer 205 may include phosphors, arsenic, antimony, boron, indium, or gallium, etc. In one embodiment, the doping concentration of the doping sidewall spacer material layer 205 may be approximately greater than $10^{18}$ $cm^{-3}$.

The doping sidewall spacer material layer 205 may be used to subsequently form doping sidewall spacers. Since the doping concentration of the doping sidewall spacer material layer 205 may be relatively large, a doping concentration of the subsequently formed doping sidewall spacers may also be relatively large.

Various processes may be used to form the doping sidewall spacer material layer 205, such as a CVD process, a PVD process, an FCVD process, or an atomic layer deposition (ALD) process, etc.

Figure 6:
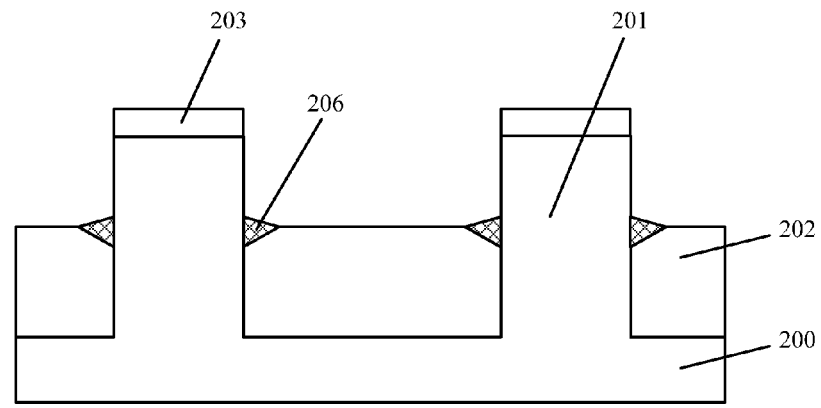

Returning to FIG. 12, after forming the doping sidewall spacer material layer 205, doping sidewall spacers may be formed by an etch back process (S104). FIG. 6 illustrates a corresponding semiconductor structure.

As shown in FIG. 6, doping sidewall spacers 206 are formed in the trenches 204 and on the bottom portion of the sidewalls of the fins 201. The doping sidewall spacer 206 are lower than the fins 201.

The doping sidewall spacers 206 may be formed by etching the doping sidewall spacer material layer 205 using an etch back process. A etching process for the etch back process may include a plasma etching process, a reactive ion etching (RIE) process, an ion beam etching process, or a wet chemical etching process, etc. In one embodiment, the etching process is a RIE process.

The RIE process may have a relatively good directivity, and an etching mask may be unnecessarily needed if the RIE process is used for the etching back process to etch the doping sidewall spacer material layer 205. Referring to FIGS. 4-5, the doping sidewall spacer material layer 205 may fill up the trenches 204, the thickness a portion of the doping sidewall spacer material layer 205 contacting the fins 201 may be greater than the thickness of a middle portion of the doping sidewall spacer material layer 205. After the etch back process (the RIE process), the middle portion of the doping sidewall spacer material layer 205 may be completely removed, while the portion of the doping sidewall spacer material layer 205 contacting with the fins 201 may be kept, thus the doping sidewall spacers 206 may be formed. Portions of the doping sidewall spacer material layer 205 on the surfaces of the hard mask layers 203 and on the sidewalls of the fins 201 may be removed by the etch back process.

By adjusting parameters of the etching process, such as the etching time, a height of the doping sidewall spacers 206 may be made to be smaller than a height of the fins 201. Wherein the height of the fins 201 may refer to a height of a portion of the fins 201 protruding out the surface of the isolation structures 202. In one embodiment, the height of the doping sidewall spacers 206 may be smaller than one third of the height of the fins 201, which may cause subsequently formed punch-through stop layers to be only formed on the bottom of the fins 201.

The doping sidewall spacers 206 may be formed by etching the doping sidewall spacer material layer 205, thus the doping type and the doping concentration of the doping sidewall spacers 206 may be same as the doping type and the doping concentration of the doping sidewall spacer material layer 205. The doping type of the doping sidewall spacers 206 may also be same as the doping type of the fins 201, and the doping concentration of the doping sidewall spacers 206 may be greater than the doping concentration of the fins 201.

Figure 7:
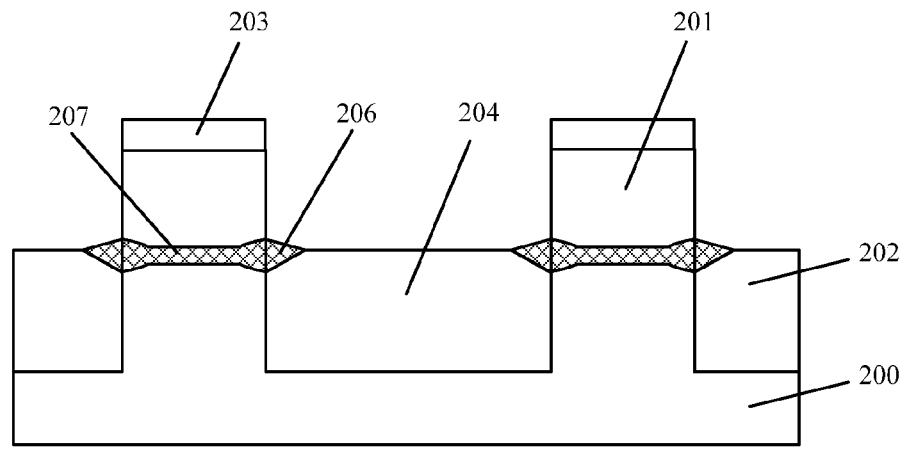

Returning to FIG. 12, after forming the doping sidewall spacers 206, punch-through stop layers may be formed by a thermal annealing process (S105). FIG. 7 illustrates a corresponding semiconductor structure.

As shown in FIG. 7, punch-through stop layers 207 are at the bottom of the fins 201 (with respect to the isolation structures 202). The punch-through stop layers 207 may be formed by a thermal annealing process. The thermal annealing process may cause the doping ions in the doping sidewall spacers 206 to diffuse into the fins 201 along the bottom of the fins 201.

A temperature of the thermal annealing process may be in a range of approximately 800° C.~1000° C. A duration of the thermal annealing process may be approximately 1 minute.

Since the doping concentration of the doping sidewall spacers 206 may be greater than the doping concentration of the fins 201, the doping rate of the doping ions may be increased during the thermal annealing process, and the doping ions in the doping sidewall spacers 206 may diffuse into the fins 201 along the bottom of the fins 201. Further, the doping sidewall spacers 206 and the fins 201 may have a same doping type, after the doping ions diffuse into the fins 201, the doping concentration of portions of the fins 201 corresponding to the doping sidewall spacers 206 may increase, thus the punch-through stop layers 207 may be formed. A doping concentration of the punch-through stop layers 207 may be greater than the doping concentration of the fins 201, which may effectively reduce a broadening of space-charge regions under an electric filed. An connection between space-charge regions of source regions and space-charge regions of drain regions may be prevented, thus the generation of punch-through phenomena may be reduced.

In certain other embodiments, after the thermal annealing process for the punch-through stop layers 207, the doping sidewall spacers 206 may be removed. The effect of the doping sidewalls 206 on the performance of the transistor may be avoided.

The doping sidewall spacers 206 may be removed by any appropriate process, such as a selective etching process, a plasma etching process, an ion beam etching process, or a wet etching process, etc. In one embodiment, the doping sidewall spacers 206 may be removed by a selective etching process.

Figure 8:
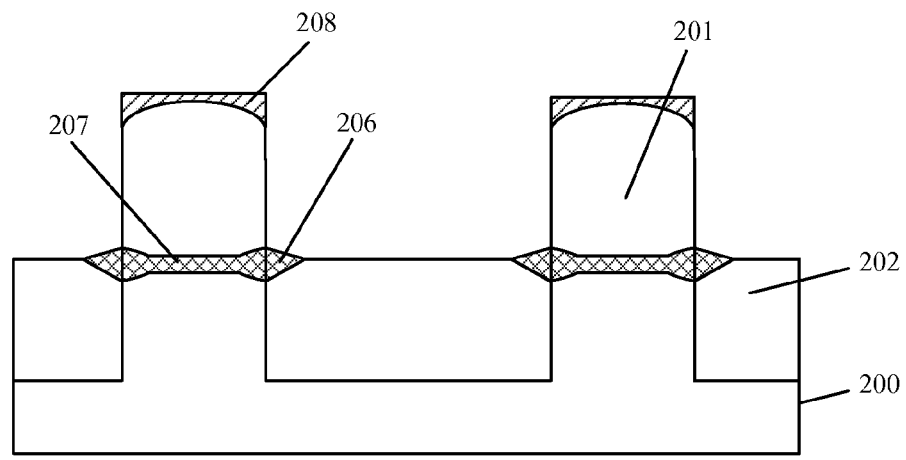

Returning to FIG. 12, after forming the punch-through stop layers 207, the hard mask layers 203 may be removed, and top portions of the fins 201 may be removed (S106). FIG. 8 illustrates a corresponding semiconductor structure.

As shown in FIG. 8, the hard mask layer 203 is removed. The hard mask layer 203 may be removed by any appropriate process, such as a dry etching process, or a wet etching process, etc.

Further, an oxide layer 208 may be formed on the top portion of each of the fins 201 after removing the hard mask layer 203. The oxide layer 208 may be formed by any appropriate process, such as a thermal oxidation process, a plasma oxidation process, or a chemical oxidation process, etc. An oxidation solution of the chemical oxidation process may be a mixture of $H_2SO_4$ and $H_2O_2$. Other oxidation solution may also be used.

After forming the oxide layer 208, the oxide layer 208 may be removed. The oxide layer 208 may be removed by any appropriate process, such as a plasma etching process, or a chemical etching process, etc.

Since the fins 201 may be formed by etching the semiconductor substrate 200, the fins 201 may often have protruding vertex angles, and the surfaces of the fins 201 may have surface defects. The oxide layer 208 may be formed by oxidizing the protruding vertex angles and the surfaces of the fins 201. During an oxidation process, the specific area of the vertex angles are relatively large, they may easily be oxidized. After removing the oxide layer 208, the surface defects of the fins 201 may removed, and the vertex angles may also be removed. Thus, the surfaces of the fins 201 may become smooth (may refer as a rounding process), and the quality of crystal lattices may be improved. The performance of a subsequently formed FinFET may be enhanced.

Further, after removing the oxide layer 208, a thermal annealing process may be performed. Various gases may be used as an environment gas of the thermal annealing process, such as nitrogen, or hydrogen, etc. In one embodiment, hydrogen may be used as the environment gas of the thermal annealing process. The thermal annealing process in hydrogen environment may further repair the surfaces of the fins 201, and may improve the crystal structures of the surfaces of the fins 201. The performance of the FinFET may be improved.

Figure 9:
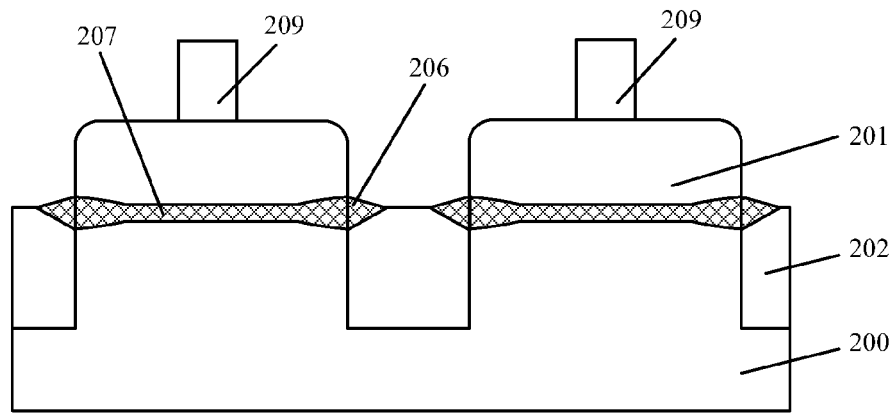

Returning to FIG. 12, after repairing the surface of the fins 201, a dummy gate may be formed on each of the fins 201 (S107). FIG. 9 illustrates a corresponding semiconductor structure along the BB1 direction shown in FIG. 2.

As shown in FIG. 9, a dummy gate 209 is formed on etch of the fins 201. The dummy gate 209 may cover portions of the surface and the sidewalls of the fin 201.

A process for the dummy gate 209 may include: forming a dummy gate material layer (not shown) on the surface of the isolation structures 202 and the fins 201, a thickness of the dummy gate material layer may be greater than the height of the fins 201. The process for the dummy gate 209 may also include polishing the dummy gate material layer to make the surface of the dummy gate material layer smooth. Further, the process for the dummy gate 209 may include forming a photoresist layer on the dummy gate material layer with patterns corresponding to the dummy gates 209. Further, the process for the dummy gate 209 may also include etching the dummy gate material layer using the photoresist layer as an etching mask. Thus, the dummy gate 209 may be formed on each of the fins 201, and the dummy gate 209 may cover the top surface and the sidewalls of the fin 201.

The dummy gate material layer may be made of any appropriate material, such as poly silicon, silicon oxide, photoresist, or metal material, etc. Various processes may be used to form the dummy gate material layer on the fins 201 and the isolation structures 202, such as a CVD process, a PVD process, an ALD process, or a spin-coating process, etc. A polishing process for smoothing the dummy gate material layer may include a mechanical polishing process, a chemical mechanical polishing (CMP) process, or an ion beam polishing process, etc. In one embodiment, the dummy gate material layer is polished by a CMP process. The dummy gate material layer may be etched by any appropriate process, such as a dry etching process, or a wet etching process, etc. In one embodiment, a dry etching process is used to etch the dummy gate material layer.

For illustrative purposes, a gate-last process may be used to form a FinFET. Wherein the gate-last process may refer that a dummy gate is formed firstly, then a gate dielectric layer and a metal gate may subsequently be formed after removing the dummy gate. The gate-last process may reduce the thermal budgets of a gate structure, which may enhance the performance of the FinFET. In certain other embodiments, a gate dielectric layer and a metal gate may be formed directly, and a dummy gate may unnecessarily be formed.

Returning to FIG. 12, after forming the dummy gate 209, sidewall spacers may be formed on both sides of the dummy gate 209; source/drain regions may be formed in the fins 201; and a dielectric layer may be formed on the isolation structures 202 and the fins 201 (S108). FIG. 10 illustrates a corresponding semiconductor structure.

As shown in FIG. 10, sidewall spacers 210 are formed on both sides of the dummy gates 209. The sidewall spacers 210 may be formed by sequentially: forming a sidewall spacer material layer (not shown) on the dummy gate structures 209, the surfaces of the fins 201 and the isolation structures 202; and performing an etch back process. The sidewall spacer material on the sidewalls of the dummy gate structures 209 may be kept to form the sidewall spacers 210. The sidewall spacer material on the isolation structures 202 and the surfaces of the fins 201 may be removed.

The sidewall spacers 210 may be a single layer. The sidewall spacers 210 may also be a stacked layer having different materials. The sidewall spacers 210 may be made of one or more of silicon nitride, silicon oxide, and silicon oxynitride, etc.

Various processes may be used to form the sidewall spacer material layer, such as a CVD process, a PVD process, or an FCVD process, etc. The etch back process may include a dry etching process, or a wet etching process, etc.

Further, after forming the sidewall spacers 210, the source/drain regions 211 may be formed. Various processes may be used to form the source/drain regions 211, such as a direct ion implantation process, or an embedding process, etc. In one embodiment, the source/drain regions 211 are formed by an embedding process. The embedding process for forming the source/drain regions 211 may include sequentially: removing portions of each of the fins 201 at both sides of the dummy gate 209; filling the removed portions with semiconductor materials or conductive materials.

Therefore, the embedded source/drain regions 211 may be formed. The semiconductor material may include silicon germanium, silicon carbide or silicon nitride, etc. Other appropriate material may also be used as the semiconductor material to form the source/drain regions 211. A stress may be introduced into the channel region of a transistor by the embedded source/drain regions 211, and the carrier mobility of the channel region may be increased.

The portions of the fins 201 may be removed by any appropriate process, such as a dry etching process, or a wet etching process, etc. Various methods may be used to fill the semiconductor material, such as a PVD process, a CVD process, an FCVD process, or a selective epitaxial growth process, etc.

In certain other embodiments, the source/drain regions 211 may also be formed by an ion implantation process. The ion implantation process may be performed on portions of the fins 201 at both sides of the dummy gate 209, thus the source/drain regions 211 may be directly formed.

Further, after forming the source/drain regions 211, the dielectric material layer 212 (may refer as ILD0) may be formed to cover the fins 201 and the isolation structures 202. The dielectric material layer 212 may be formed by sequentially: forming a dielectric material layer on the fins 201 and the isolation structures 202; and polishing the dielectric material layer to expose the top surface of the dummy gate 209. Thus, the dielectric material layer 212 leveling with the top surface of the dummy gate 209 may be formed. A polishing process may be a mechanical polishing process, or a chemical mechanical polishing (CMP) process, etc. In one embodiment, the polishing process is a CMP process.

The dielectric material layer 212 may be made of any appropriate material, such as silicon oxide, silicon nitride, or silicon oxynitride, etc. The dielectric material layer 212 may function as an isolation layer.

Returning to FIG. 12, after forming the dielectric material layer 212, a gate structure may be formed on each of the fins 201 (S109). FIG. 11 illustrates a corresponding semiconductor structure.

As shown in FIG. 11, a gate structure is formed on each of the fins 201. The gate structure may include a gate dielectric layer (not shown) on the fin 201 and a metal gate 213 on the gate dielectric layer. The gate structure may be formed by sequentially: removing the dummy gate 209 to form a first opening; forming the a gate dielectric material layer on the fin 201 at the bottom of the first opening; and forming a metal material layer on the gate dielectric material layer.

The dummy gate 209 may be removed by any appropriate process, such as a dry etching process, or a wet etching process, etc.

The gate dielectric material layer may be made of one or more of high-K dielectric material such as $Hfo_2$, $Al_2O_3$, $ZrO_2$, HfSiO, HfSiON, HfTaO, and HfZrO, etc. Other appropriate material may also be used as the gate dielectric material. The metal gate material layer may be made of one or more of W, Al, Cu, Ti, Ta, TaN, NiSi, CoSi, TiN, TiAl, and TaSiN, etc.

Various processes may be used to form the gate dielectric material layer and the metal gate 213, such as a CVD process, a PVD process, an ALD process, an FCVD process, or an electro-deposition process, etc.

After forming the gate dielectric material layer and the metal gate material layer, a polishing process may be performed to polish the gate dielectric material layer and the metal gate material layer until the top surface of the interlayer dielectric layer 212 is exposed, thus the gate dielectric layer (not shown) and the metal gate 213 may be formed. A polishing process may include a mechanical polishing process, or a CMP process, etc. The gate structure consisting of the gate dielectric layer and the metal gate 213 is formed, and may be referred as a high-K metal gate.

In one embodiment, the gate structure may be formed by a gate-last process, i.e., the gate dielectric layer and the metal gate 213 are formed after forming the source/drain regions 211, a thermal budget of the gate dielectric layer and the metal gate 213 may be reduced. Thus, a desired threshold voltage of the transistor may be obtained, and the performance of the transistor may be improved.

Thus, a FinFET may be formed by the above disclosed processes and methods. The corresponding FinFET is shown in FIG. 11. The FinFET includes a semiconductor substrate 200 having a plurality of fins 201 and isolation structures 202, and embedded source/region regions 211 at both sides of the fins 201. The FinFET also includes a punch-through stop layer 207 at the bottom of each of the fins 201. Further, the FinFET includes metal gates 213 and sidewall spacers 210. Further, the FinFET also includes a dielectric material layer 212 covering the source/drain regions 211, the sidewall spacers 210, and the isolation structures 202. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor, comprising:
    providing a semiconductor substrate;
    forming a plurality of fins on the top of the semiconductor substrate;
    forming isolation structures between adjacent fins;
    forming doping sidewall spacers in top portions of the isolation structures near the fins;
    forming a punch-through stop layer at the bottom of each of the fins by thermal annealing of the doping sidewall spacers; and
    forming a high-K metal gate on each of the fins.

2. The method according claim 1, after forming the fins, further including:
    forming a hard mask layer on each of the fins.

3. The method according to claim 1, wherein forming the doping sidewall spacers further includes:
    forming trenches in the top portions of isolation structures near the fins;
    forming a doping sidewall spacer material layer on the isolation structures and the trenches; and
    performing an etch back process to remove the doping sidewall spacer material layer on the isolation structures.

4. The method according to claim 1, after forming the doping sidewalls, further including:
    form an oxide layer on each of the fins;
    removing the oxide layer to remove vertex angles and surface defects of the fins; and
    annealing the fins in a hydrogen environment.

5. The method according to claim 1, wherein forming the high-K metal gate further includes:
    forming a dummy gate on each of the fins;
    forming sidewall spacers on both sides of the dummy gate;
    forming source/drain regions in the fin at both sides of the dummy gate;
    forming a dielectric material layer covering the fins, the source/drain regions, and the isolation structures;
    removing the dummy gate to form a first opening;
    forming a gate dielectric layer in the first opening; and
    forming a metal gate on the gate dielectric layer.

6. The method according to claim 1, wherein:
    the doping sidewall is made of one or more of $SiO_2$, $SiN_x$, SiCO, SiCON, SiOF, SOG, high-k materials, low-k materials, poly-Si, a-Si, or Ge with III or V column doping elements.

7. The method according to claim 1, wherein:
    a doping concentration of the doping sidewall spacers is greater than a doping concentration of the fins; and
    a doping concentration of the punch-through stop layer is greater than the doping concentration of the fins.

8. The method according to claim 1, wherein:
    a height of the doping sidewall spacers is approximately smaller than one third of a height of the fins.

9. The method according to claim 1, wherein:
    the isolation structures are formed by a dry etching process with $NH_3$ and HF as etching gases.

10. The method according to claim 1, wherein:
a temperature of the thermal annealing process is in a range of approximately 800° C.~1000° C.; and
a duration of the thermal anneal process is approximately 1 minute.

11. The method according to claim 1, wherein:
the source/drain regions are embedded source/drain regions.

12. The method according to claim 7, wherein:
the doping concentration of the doping sidewall spacers is greater than $10^{18}$ cm$^{-3}$.

13. The method according to claim 11, wherein:
the embedded source/drain regions is made of germanium or silicon carbide.

14. A method for fabricating a fin field-effect transistor, comprising:
providing a semiconductor substrate;
forming a plurality of fins on the top of the semiconductor substrate;
forming isolation structures between adjacent fins;
forming doping sidewall spacers at fins;
forming a diffusion layer at the fins by thermal annealing of the doping sidewall spacers; and
forming a high-K metal gate on each of the fins.

* * * * *